United States Patent [19]

Kane

[11] Patent Number: 5,055,836

[45] Date of Patent: Oct. 8, 1991

[54] WIDEBAND SOLID-STATE ANALOG SWITCH

[75] Inventor: Michael G. Kane, Rocky Hill, N.J.

[73] Assignee: Siemens Aktiengesellschaft, Berlin and Munich, Fed. Rep. of Germany

[21] Appl. No.: 281,116

[22] Filed: Dec. 7, 1988

[51] Int. Cl.$^5$ ............................................. H04Q 1/00
[52] U.S. Cl. ........................ 340/825.85; 340/825.89; 340/825.91; 340/825.93; 307/241
[58] Field of Search ...................... 340/825.79, 825.85, 340/825.9, 825.91, 825.93, 825.89; 358/181; 379/54, 291, 292, 306; 307/239, 241, 242, 254

[56] References Cited

U.S. PATENT DOCUMENTS

| | | | |
|---|---|---|---|
| 4,274,112 | 6/1981 | Leysieffer et al. | 340/825.89 |
| 4,346,381 | 8/1982 | Bauch et al. | 340/825.93 |
| 4,535,360 | 8/1985 | Briley et al. | 358/181 |
| 4,746,921 | 5/1988 | Hofmann | 340/825.87 |
| 4,754,409 | 5/1988 | Hofmann | 340/825.87 |
| 4,801,936 | 1/1989 | Hofmann | 340/825.91 |

OTHER PUBLICATIONS

Sunazawa et al., "Wideband Integrated Crosspoint Switch Matrix", Review of the Electrical Comm. Lab., vol. 25, No. 1-2, pp. 43-51, 01-1977.
IEEE Journal of Solid-State Circuits, vol. SC-21, No. 1, Feb. 1986, "A GaAs Data Switching IC for a Gigabits Per Second Communication Sys.", pp. 157-161.
Technology Update (May 14, 1987), "Improved Analog Switches and Multiplexers Bring Benefits to Old and New Applications" by Peter Harold: pp. 65-74.
Electronics Letters (Sep. 12, 1985), vol. 21, No. 19, pp. 854-855.

Primary Examiner—Donald J. Yusko
Assistant Examiner—Edwin C. Holloway, III

[57] ABSTRACT

A wideband analog solid-state switch is provided as a component in an M×N crosspoint matrix switch for routing one of N inputs to one or more of M outputs.

The basic switch comprises an inversion circuit and a control circuit. The inversion circuit consists of three field-effect transistors (FETs) that are connected in series along their source-drain paths, thus forming a path between a voltage source and ground. The input signal is connected to the control input of the first FET. When the switch is ON, the first FET modulates the current flowing through the conducting paths of the three FETs. The third FET provides a non-linear load. The output is measured across the third FET. When the switch is OFF, the second FET prevents current from leaking through the first FET to the output.

For the M×N crosspoint matrix switch, each of M rows of output lines has N crosspoints, with each crosspoint switching its associated input signal onto an output line. Therefore, one input can be routed over more than one output line. Each crosspoint consists of the basic switch without the FET constituting the non-linear load. The crosspoints for each row are connected in parallel such that they share a common non-linear load FET. Therefore, once a crosspoint is actuated, the selected crosspoint and common FET function as the basic switch described above. The output of each row can be fed into an amplifier in order to improve the output drive capability.

22 Claims, 9 Drawing Sheets

WIDEBAND SOLID-STATE ANALOG SWITCH

BACKGROUND OF THE INVENTION

This invention relates to a wideband solid-state analog switch and more particularly to such a switch for use in an M-by-N analog crosspoint matrix switch for routing one of N inputs over one or more of M outputs.

Multichannel mobile and satellite communications systems require switch arrays that can route high frequency signals to various points under system control. For example, a crosspoint matrix uses an M-by-N array of switches to direct any of N inputs to any of M outputs. In the past, where large input voltages are used, the switches were built from coaxial relays. However, arrays of coaxial relays were generally large, expensive and consumed a great deal of power. Therefore, it became important to build switches from solid-state switching elements, ideally all on the same semiconducting substrate.

Recent advances in semiconductor fabrication processes have made possible the application of analog switches using solid-state switching elements. Solid-state analog switches can now be made with lower on-resistance, faster switching and reduced power consumption. With improvements in MOS technology one achieves improved breakdown-voltage tolerance and reduced leakage current such that these switches can now handle signals with a range of ±70 V. When used in high-speed switching systems, the analog switch must possess the following characteristics:

1. Wide Bandwidth—because the number of channels in communications links is limited and signals are multiplexed at high frequencies, the switch must operate over a wide bandwidth;

2. Wide Dynamic Range With Low Distortion—the switch must pass the signal with little distortion over the dynamic range of the signal (non-linearities in the input-output transfer characteristic of the switch lead to differential-gain error in analog signals);

3. High Isolation—to avoid crosstalk between channels, the switch, when open, must not allow an input signal to leak through to an output;

4. Low Insertion Loss—the switch must be transparent (offer low resistance) to the input signal when it is closed; and 5. Broadcasting Capability—the switch must be able to route one input signal to more than one output. It is understood that for the signal not to be degraded in this mode, the loading of the switch elements on the input signal must be small.

Presently, T-switches are employed in these high-speed switching systems. The T-switch employs three N-channel field-effect transistors (FETs). The arms of the T are formed by two FETs connected in series along the drain-source path. They act as pass-transistors and when turned on, the first FET passes the input to the second FET which outputs the signal. The third FET is connected from ground to the point between the two pass transistors. When the first and second transistors are turned off, the third transistor is turned on; therefore, any AC current that leaks through the first pass-transistor is shunted to ground. In this manner, the third FET prevents leakage current from being output. When CMOS technology is used, the N-channel FETs are replaced by transmission-gates employing paralleled N-channel and P-channel devices.

The T-switch is fabricated on a single semiconducting substrate. While it offers good isolation, small size and low power dissipation, all at a low cost, the T-switch has one major drawback: the aforementioned advantages are only available when the T-switch operates within a limited dynamic range over a wide dynamic range, the linearity of the T-switch is poor because the on-resistance of the two pass-transistors varies with the signal level. In addition, the bandwidth is limited by the series resistance of the two pass-transistors. The series resistance also causes insertion loss at low frequencies, thereby attenuating the signal voltage whenever the source resistance load resistance are low. Because the loading of the transmission line feeding the switch typically ranges between 50 and 75 ohms, the series resistance of the pass-transistors (40–100 ohms) introduces a 5–10 dB loss. Although the resistance can be lowered by increasing the size of each pass-transistor, the resulting increase in shunt capacitance still degrades the bandwidth. By compensating for this loss with subsequent amplification of the output signal, the bandwidth is further limited.

Furthermore, broadcasting does not work well with the T-switch. The high loading of the transmission line feeding the switch degrades the output signal as each switching point that is turned on introduces additional loading on the input signal, thereby further increasing the attenuation. The transmission line cannot be properly terminated in its characteristic impedance unless a resistive termination is placed before the switch, and the switch is followed by a buffer or amplifier to drive the output cable.

The Siliconix DG536 is an example of an off-the-shelf, high-performance wideband analog switch. Its bandwidth is 300 MHz and its all-hostile crosstalk level is −60 dB at 5 MHz.

The prior art was aware of the need to provide a wideband analog switch. Reference is made to the following:

An article entitled "Improved Analog Switches & Multiplexers Bring Benefits To Old & New Applications" by Peter Harold in EDN, May 14, 1987, pp. 65–74. The article gives examples of CMOS circuits employed as switches available from different manufacturers with the operating characteristics. The article discusses the term "All-Hostile" cross talk.

See article entitled "Gigahertz-Band Analogue Switch Using Bipolar Super Self-Aligned Process Technology" by H. Kikuchi et al., Electronic Letters, Sept. 12, 1985, Volume 21, No. 19, pages 854–855. The article describes a bipolar analog switch using super self-aligned process technology (SST). The switch employs three emitter-coupled pairs and achieves a net isolation of 40 dB and low third-order intermodulation of less than −40 dB below the input level of −7 dBm at 1 GHZ. The schematic of the switch is shown in FIG. 1 in the article.

See also an article entitled "A GaAs Switching IC for a Gigabits Per Second Communication System" by Y. Nakayama-et al., published in the IEEE Journal of Solid State Circuits, Vol. SC-21, No. 1, February, 1986, pp. 157–161. The articles describes a monolithic 4×4 switching circuit which employs built in address decoders and is ECL compatible.

Therefore, it is an object of the present invention to provide an improved analog solid-state switch which operates over a wide bandwidth while offering little distortion of the input signal.

An additional object of the present invention is to implement the improved analog solid-state switch with field-effect transistor (FET) technology.

A further object of the present invention is to increase the dynamic range of the analog solid-state switch by matching the non-linear transfer characteristics of the FETs.

Yet a further object of the present invention is to reduce insertion loss of the input signal by matching the non-linear transfer characteristics of the FETs.

A further object of the present invention is to implement the wideband analog solid-state switch in an M-by-N crosspoint matrix switch for switching one of N inputs across one or more of M outputs.

SUMMARY OF THE PRESENT INVENTION

In accordance with the teachings of the present invention, a wideband analog solid-state switch is disclosed herein. The wideband analog solid-state switch offers higher isolation and lower distortion of an input signal than a conventional T-switch. When fabricated in standard gallium arsenide technology, the switch has a bandwidth of roughly 12 GHz.

The basic switch comprises an inversion circuit and a control circuit. The inversion circuit consists of three field-effect transistors (FETs) that are connected in series along their source-drain paths. The first FET is connected to a voltage source; the third FET is connected to ground. The input signal is supplied to the gate of the third FET which modulates the current flowing through the three FETs; the output is measured as the voltage drop across the first FET. When the switch is turned off, the control circuit inactivates the first and second FETs thereby preventing current from leaking to the output. When the switch is turned on, the control circuit activates the first and second FETs simultaneously. The current that flows along the source drain path is modulated by the third FET. The first FET forms a non-linear load to the operating potential. The second and third FETs form a cascode pair. The switch inverts the input signal and adds a DC component.

Because the AC and DC components of the voltage across the first and third FETs are not identical, the non-linear transfer characteristics are not matched; therefore, the input signal is slightly distorted.

By adding a fourth transistor between the first FET and the voltage source, a second cascode pair is created that matches the first cascode pair. As a result, the DC voltages across the first and third FETs become nearly identical, thereby reducing signal distortion to very low levels.

By feeding the output of the switch into another inversion stage, the instantaneous AC values across the first and third transistors in the second stage can be matched, thereby perfectly matching the non-linear transfer characteristics and lowering the distortion of the input signal while maintaining the bandwidth of the analog solid-state switch.

An M-by-N crosspoint matrix switch can be implemented using the basic switch or either of its variations. The matrix has M rows corresponding to M output lines, and N columns corresponding to N input signals. Each row has N crosspoints, each crosspoint for switching an associated input signal onto an output line. Therefore, one input can be routed over more than one output line. When implemented with the basic switch, each crosspoint consists of the basic switch without the first transistor. The crosspoints for each row are connected in parallel to a common transistor which functions as the first transistor in the basic switch. Only one crosspoint in a row can be actuated at a time. When actuated, the crosspoint completes a circuit with the common transistor, funtioning as described above. The output of each row can be fed into an amplifier in order to improve the output drive capability.

BRIEF DESCRIPTION OF THE FIGURES

The invention will be more clearly understood by reference to the following detailed description of three exemplary embodiments thereof and their corresponding implementations in conjunction with the accompanying drawings in which.

DETAILED DESCRIPTION OF THE INVENTION

Figure 1:
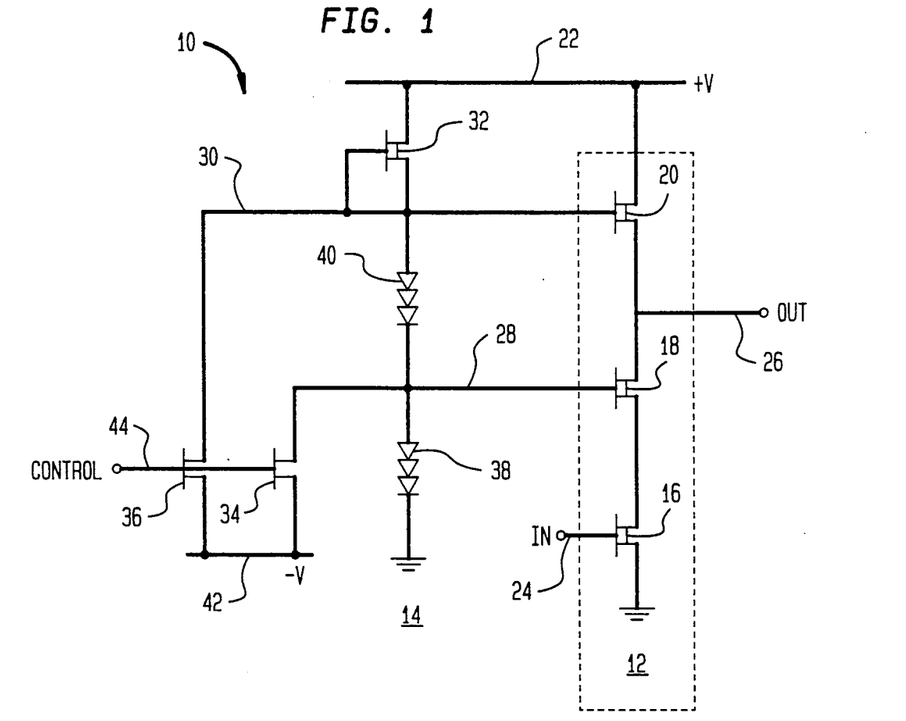
FIGS. 1 and 1B-1D are a schematic diagrams of first, second, third, and fourth embodiments, respectively, of the wideband analog solid-state switch depicted in FIG. 1A.
Figure 1A:
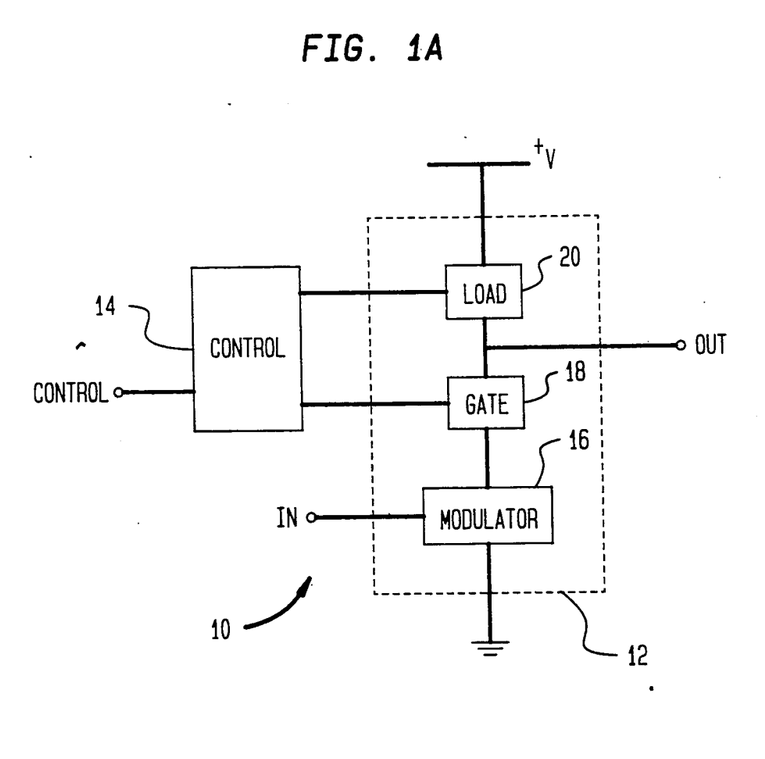
FIG. 1A is a block diagram depicting a first embodiment of a wideband analog solid-state switch according to the present invention.

Referring to FIG. 1A there is shown a block diagram depicting a first embodiment of a wideband analog solid-state switch 10 according to this invention. The basic switch 10 comprises an inversion circuit 12 (within the dashed lines), and a control circuit 14. The preferred embodiment is realized with N-channel field-effect transistors (FETs) in the depletion mode. In another realization, all P-channel FETs could be used; in yet another realization, both depletion-mode and enhancement-mode FETs could be used. While the FETs of the preferred embodiment employ Gallium Arsenide technology, the switch 10 could be implemented with any FET technology.

The inversion circuit 12 comprises a modulator 16, a gate 18 and a load 20 which are connected in series to form a path from a supply of operating potential (+V) to a point of reference potential or ground. The modulator 16 is controlled by the input signal (IN). When the switch 10 is "on", the gate 18 allows current to flow through the inversion circuit 12. The current flowing through the load 20 is modulated by the input signal. As a result, a voltage drop occurs across the load 20. The output therefore becomes the difference between the operating potential and the voltage drop across the load 20. Thus, the output is an inverted, DC-shifted replica of the input signal.

The control circuit 14 turns the switch 10 ON or OFF by supplying the proper positive or negative voltage levels to the gate 18 and the load 20. It should be understood that the control-circuit 14 to be disclosed-herein is merely exemplary and can be implemented in various other ways. The description of the control circuit 14 will follow a description of the operation of the switch. By describing the operation of the switch first, the requirements for the control circuit 14 will become more apparent.

Referring now to FIG. 1 there is shown a schematic diagram of the analog solid-state switch according to the present invention. The inversion circuit 12 comprises a first FET 16, a second FET 18 and a third FET 20, all being identical. The first FET 16 is the modulator; the second FET 18 is the gate; and the third FET 20 is the load. The FETs 16, 18 and 20 are connected in series along the source-drain paths. A supply of positive operating potential (+V) is supplied to the drain of FET 20 via conductor 22. The source of the first FET 16 is connected to ground or a point of reference potential. The input signal is applied to the gate of FET 16 via conductor 24. The signal is output over conductor 26 which is connected to the drain-source junction between the second and third FETs 18 and 20. Conductor 28 is connected to the gate of FET 18; conductor 30 is connected to the gate of FET 20.

During operation, the switch 10 is turned OFF when the gates of FETs 18 and 20 are driven more negative than their respective threshold voltages. In this state, the output on conductor 26 (OUT) is isolated from the input signal (IN) on conductor 24. The DC contribution to the output is eliminated since direct current cannot pass through the second or third FETs 18 or 20. The AC contribution to the output is eliminated since the gate of FET 18 shields the drain of FET 18 from FET 16.

The switch 10 is turned ON under the following conditions: the gate voltage of the second FET 18 is considerably more positive than the saturation (or "knee") voltage of the first FET 16; and the gate of the third FET 20 is considerably more positive than the gate plus saturation voltage of the second FET 18. In this state, the current passing through FETs 16, 18 and 20 is modulated by the input voltage applied to the gate of the first FET 16 on conductor 24. When the second and third FETs 18 and 20 are turned ON in this way, the first and second FETs 16 and 18 form a cascode pair. The gate of the third FET 20 is connected to the source of operating potential such that its drain-source path forms a low-impedance, non-linear load. Because the third FET 20 is of the same size as the first FET 16, the non-linear region of the on-resistance for the third FET 20 overlaps with that of the first FET 16 and thereby compensates for the non-linearity of FET 16 over a wide dynamic range. As a result, the output voltage on conductor 26 is a close replica of the inverse of the input signal on conductor 24, except that a DC component is added. Thus, the AC loss through the switch 10 is low. The linear transfer characteristic is maintained over a wide dynamic range. This linearity holds over temperature and processing variations since it only depends upon the first and third FETs 16 and 20 having similar characteristics, as is the case when these devices are fabricated as an integrated circuit on a common semiconductor substrate. Because this circuit only has low impedance nodes in the "on" state, and because the gain of the inversion circuit 12 is unity or less, the bandwidth can be very high, approaching the cutoff frequency of the transistor.

Figure 1B:
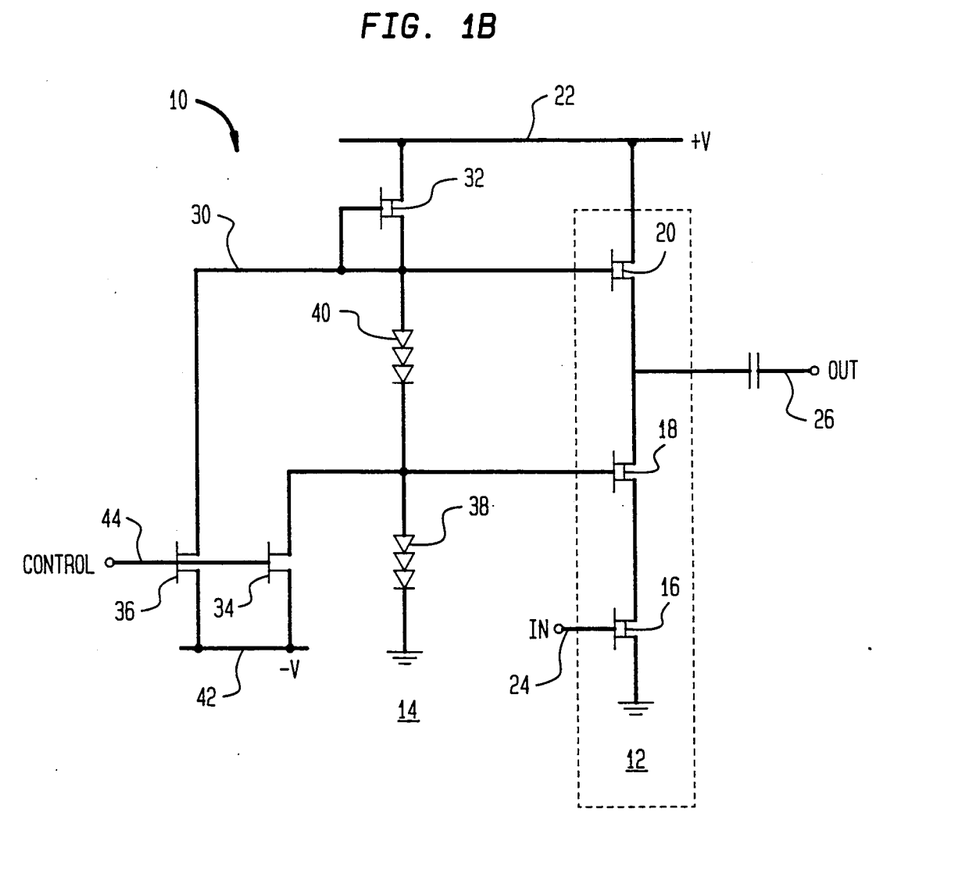
Figure 1C:
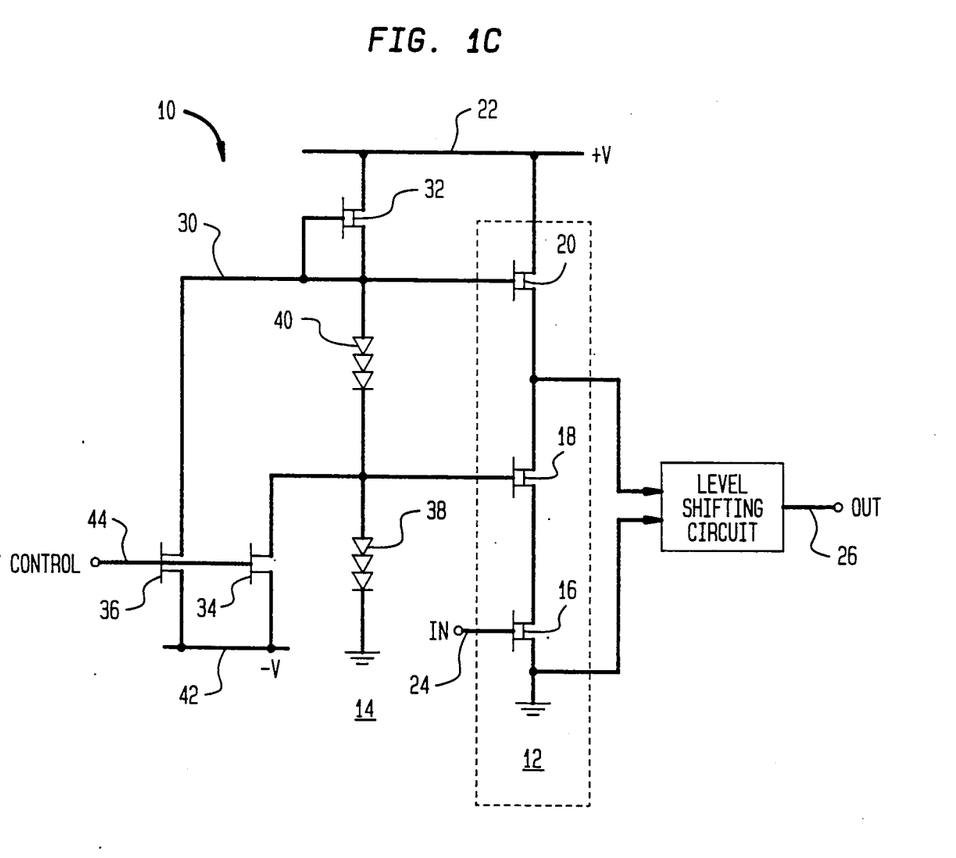
Figure 1D:
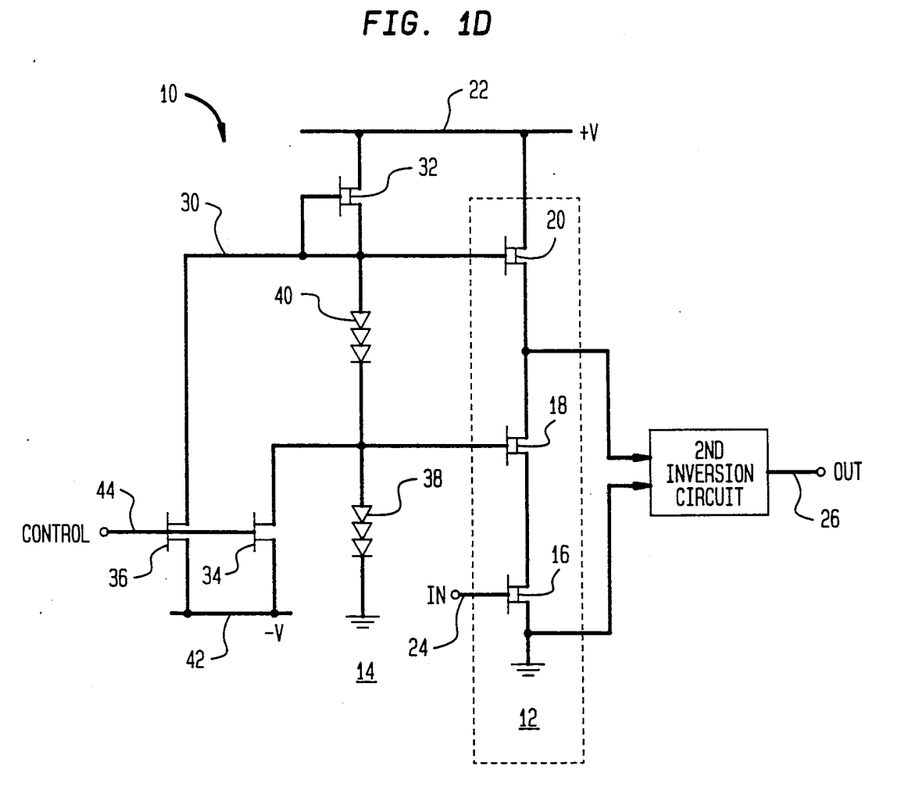

The output on conductor 26 is an inverted, DC level shifted replica of the input signal on conductor 24. To restore the DC level to ground, a blocking capacitor (FIG. 1B) or level shifting circuitry (FIG. 1C) can be added. If the polarity (or phase) of the input signal on conductor 24 is to be maintained, the output on conductor 26 must be fed into a second inversion circuit 12 (FIG. 1D). It can be seen that the inversion circuit 12 also has utility as a wideband, low-distortion linear inverting buffer.

Still referring to FIG. 1, the control circuit 14 comprises a fourth FET 32, a fifth FET 34, a sixth FET 36, and first and second diode strings 38 and 40. The drain of the fourth FET 32 is connected to the supply of positive operating potential (+V) 22. The gate of FET 32 is tied to its source, thereby creating a constant-current supply. The source of FET 32 is directed to ground by the series-connected first and second diode strings 38 and 40. The diode strings 40 and 38 may be FETs connected as diodes or actual integrated circuit diode configurations. The conductor 30 supplying the gate voltage to the third FET 20 is connected to the source of the fourth FET 32 and to the drain of the sixth FET 36. The conductor 2 supplying the gate voltage to the second FET 18 is connected to the junction between the first and second diode strings 38 and 40 and to the drain of the fifth FET 34. The sources of FETs 34 and 36 are connected to a negative supply of operating potential (−V) via conductor 42. The negative and positive supplies of operating potential do not have to be of the same magnitude. However, the negative voltage level must be less than the threshold voltages of FETs 18 and 20 respectively. A conductor 44 is connected to the gates of FETs 34 and 36 respectively. The voltage on the control conductor 44 turns the switch 10 ON or OFF.

During operation of the control circuit, a low voltage on the control conductor 44 turns the switch 10 ON. In this state FETs 34 and 36 do not conduct; therefore, the current supplied to the diode strings 38 and 40 by the current source FET 32 causes voltage drops across the diode strings 38 and 40 which operate to supply the proper positive voltage levels to FETs 18 and 20. The voltage supplied to the gate of the second FET 18 by conductor 28 is considerably more positive than the saturation voltage of the first FET 16; and due to the voltage drop across the first and second strings 38 and 40, the voltage supplied to the gate of the third FET 20 via conductor 30 is considerably more positive than the gate plus the saturation voltage of the second FET 18.

When the input on the control conductor 44 is high, the switch 10 turns OFF. With high inputs at the respective gates, FETs 34 and 36 conduct, thereby supplying negative voltages to the gates of the second and third FETs 18 and 20 respectively via conductors 28 and 30. Since the negative voltage level is below the threshold level of the FETs 18 and 20 respectively, the FETs 18 and 20 do not conduct.

In order for the switch 10 to achieve an optimum operational bandwidth, the drain-source voltage values across the first and third FETs 16 and 20 must be identical. In the embodiment illustrated in FIG. 1 however, the instantaneous AC values and the average DC values across FETs 16 and 20 are not the same; therefore, the slight mismatch between the non-linear transfer characteristics degrades the dynamic range. A second embodiment of the present invention, illustrated in FIG. 2, corrects the mismatch between the DC voltages in the switch 10 shown in FIG. 1.

Figure 2:
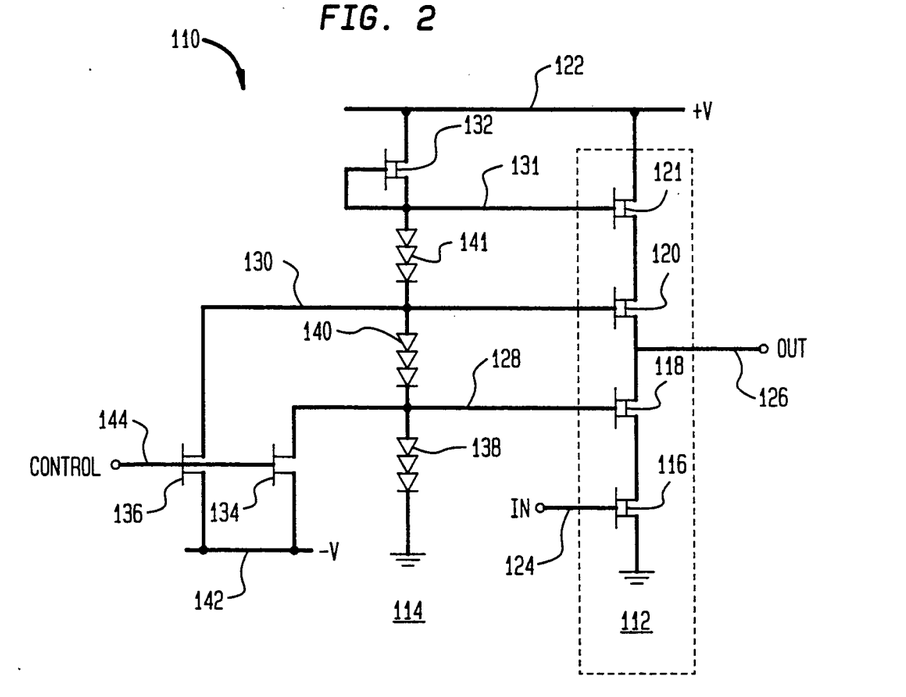
FIG. 2 is a schematic diagram depicting a second embodiment of a wideband analog solid-state switch according to the present invention.

Referring now to FIG. 2, there is shown a schematic diagram depicting a second embodiment of a wideband analog solid-state switch 110 according to this invention. This embodiment will hereinafter be referred to as a cascode switch 110. The cascode switch 110 comprises an inversion circuit 112 and a control circuit 114.

The inversion circuit 112 comprises four identical FETs 116, 118, 120 and 121 connected in series along the source-drain paths. A source of positive operating potential (+V) is supplied to the drain of FET 121 via conductor 122. The source of FET 116 is connected to ground. The input signal is applied to the gate of FET 116 via conductor 124. The signal is output over conductor 126 (OUT) which is connected to the drain-source junction between FETs 118 and 120. Conductor 128 is connected to the gate of FET 118; conductor 130 is connected to the gate of FET 120; conductor 131 is connected to the gate of FET 121.

The control circuit 114 comprises three FETs 132, 134, and 136, and three diode strings 138, 140 and 141. The drain of the FET 132 is connected to the supply of operating potential (+V). The gate of FET 132 is tied to its source, thereby creating a constant-current supply. The source of FET 132 is tied to conductor 131 which is directed to ground by the series-connected diode strings 138, 140 and 141. The conductor 130 is connected to the junction between diode strings 140 and 141 and to the drain of FET 136. The conductor 128 is connected to the junction between diode strings 138 and 140 and to the drain of FET 134. The sources of FETs 134 and 136 are connected to a negative source of operating potential (−V) via conductor 142. A control conductor 144 is connected to the respective gates of FETs 134 and 136.

The cascode switch 110 operates in basically the same manner as the switch 10 illustrated in FIG. 1. The cascode pair formed by FETs 116 and 118 is matched to the cascode load pair formed by FETs 120 and 121. To achieve this matching, the difference between the gate voltage of FET 118 and the average gate voltage of FET 116 must equal the difference between the gate voltages of FETs 120 and 121. Assuming that the input signal is entered about zero volts, this equality is assured by diode strings 138 and 141. Just as FETs 116 and 120 are the same size, FETs 118 and 121 must also be the same size. When the cascode switch 110 is turned OFF, FETs 118 and 120 are turned OFF as with the switch 10 illustrated in FIG. 1. When the cascode switch 110 is turned ON, the control circuit 114 supplies the required gate voltages for FETs 118, 120 and 121 via the voltage drops across the diode strings 138, 140 and 141 due to the current source FET 132. By matching the average DC voltages across FETs 116 and 120, the non-linear transfer characteristics are matched, thereby providing an overall linear characteristic that is superior to the switch 10 illustrated in FIG. 1. The addition of FET 121 does not degrade the bandwidth.

While the cascode switch 110 shown in FIG. 2 corrects the mismatch of DC voltages, it does not correct the mismatch of the instantaneous AC voltages across FETs 116 and 120. A third embodiment of the present invention, depicted in FIG. 3, corrects for both mismatches; therefore, it achieves the optimum operational linearity.

Figure 3:
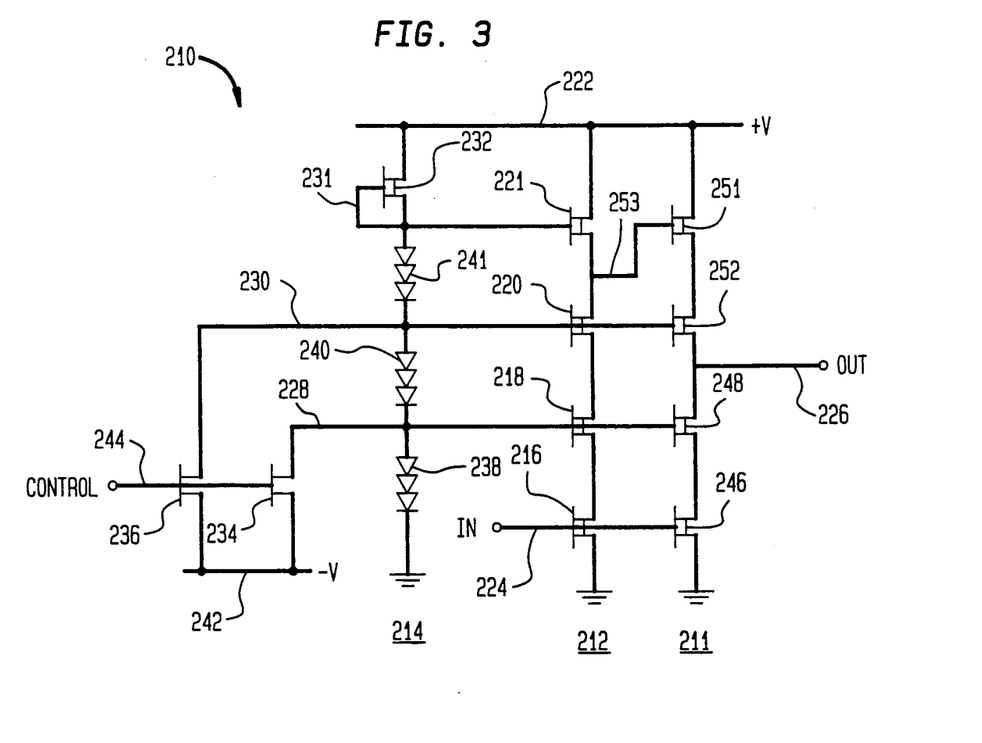
FIG. 3 is a schematic diagram depicting a third embodiment of a wideband analog solid-state switch according to the present invention.

Referring now to FIG. 3, there is shown a schematic diagram depicting a third embodiment of a wideband analog solid-state switch 210 according to the present invention. The third embodiment will hereinafter be referred to as a two-stage switch 210. The two-stage switch comprises a first inversion circuit 211, a second inversion circuit 212, and a control circuit 214. Essentially, the two-stage switch 210 is the cascode switch 110 illustrated in FIG. 1 feeding into another inversion circuit 211.

The inversion circuit 212 comprises four identical FETs 216, 218, 220 and 221 connected in series along the source-drain paths. The FETs form a path between ground and a source of positive operating potential (+V), connected via conductor 222. The input signal (IN) is applied to the gate of FET 216 via conductor 224. Conductor 228 is connected to the gate of FET 218; conductor 230 is connected to the gate of FET 220; conductor 231 is connected to the gate of FET 221.

Another inversion circuit 211 comprises four identical FETs 246, 248, 250 and 251 connected in series along the source-drain paths. The FETs 246, 248, 250 and 251 form a path between ground and the positive operating potential (+V). The ratios among FETs 246, 248, 250 and 251 are the same as FETs 216, 218, 220 and 221 as used in the second inversion circuit. Preferably, all the FETs are identical. The input signal (IN) is applied to the gate of FET 246 via conductor 224. Conductor 228 is connected to the gate of FET 248; conductor 230 is connected to the gate of FET 250; conductor 231 is connected to the gate of FET 251. The signal is output over conductor 226 which is connected to the drain-source junction between FETs 248 and 252. The gate of FET 251 is connected to the junction between the source and drain of FETs 220 and 221 via conductor 253.

The control circuit 214 comprises three FETs 232, 234, and 236, and three diode strings 238, 240 and 241. The drain of the FET 232 is connected to the operating potential +V. The gate of FET 232 is tied to its source, thereby creating a constant-current supply. The source of FET 232 is tied to conductor 231 which is directed to ground by the series-connected diode strings 238, 240 and 241. The conductor 230 is connected to the junction between diode strings 240 and 241 and to the drain of FET 236. The conductor 228 is connected to the junction between diode strings 238 and 240 and to the drain of FET 234. The sources of FETs 234 and 236 are connected to a negative supply of operating potential (−V) via conductor 242. This potential does not need to be of the same magnitude as the positive potential +V. A control conductor 244 is connected to the respective gates of FETs 234 and 236.

The two-stage switch operates the same as the cascode switch 110 illustrated in FIG. 1, except that FET 251 of the first inversion stage 211 is provided with a gate voltage whose instantaneous AC value varies with the inversion of the input signal supplied by conductor 224. As a result, all voltages across FET 252 are forced to track those across FET 246. By matching the instantaneous voltages across FETs 246 and 252, attenuation and non-linearity introduced by the switch 210 are rendered insignificant over a wide dynamic range. Consequently, insertion loss is decreased while the bandwidth is maintained.

Figure 4:
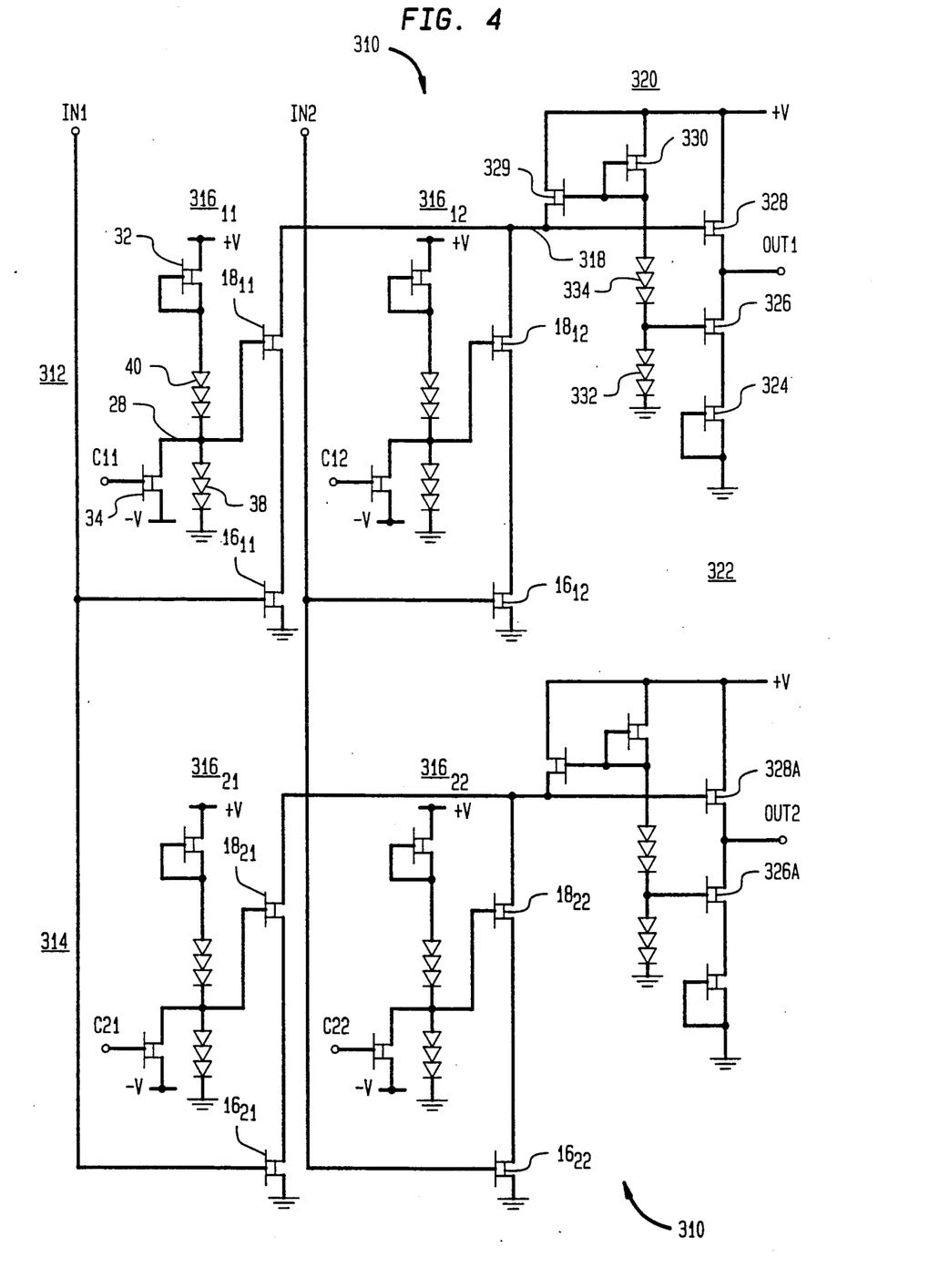
FIG. 4 is a schematic diagram of a crosspoint matrix switch implementation using the wideband analog solid-state switch illustrated in FIG. 1.
Figure 5:
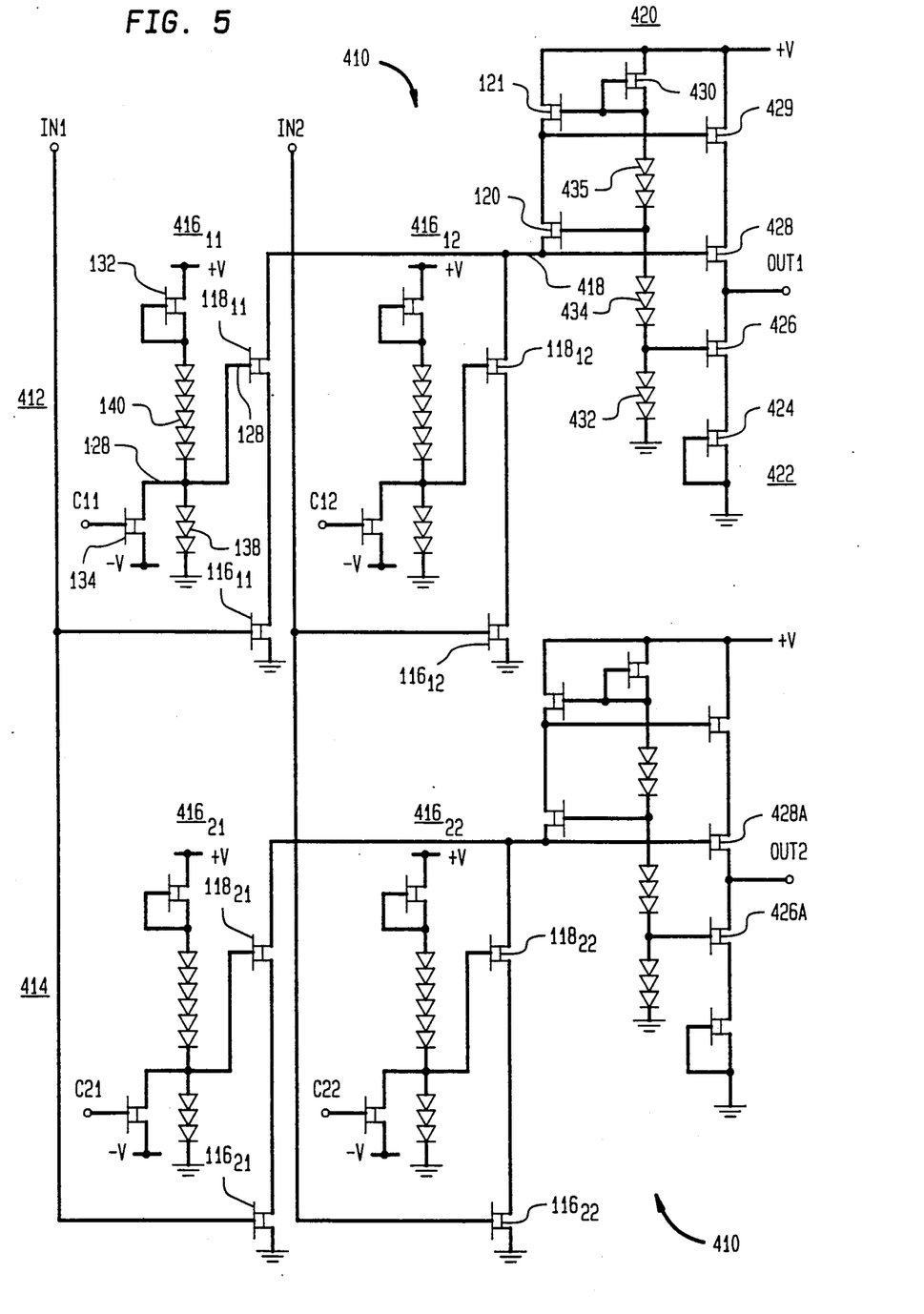
FIG. 5 is a schematic diagram of a crosspoint matrix switch implementation using the wideband analog solid-state switch illustrated in FIG. 2.
Figure 6:
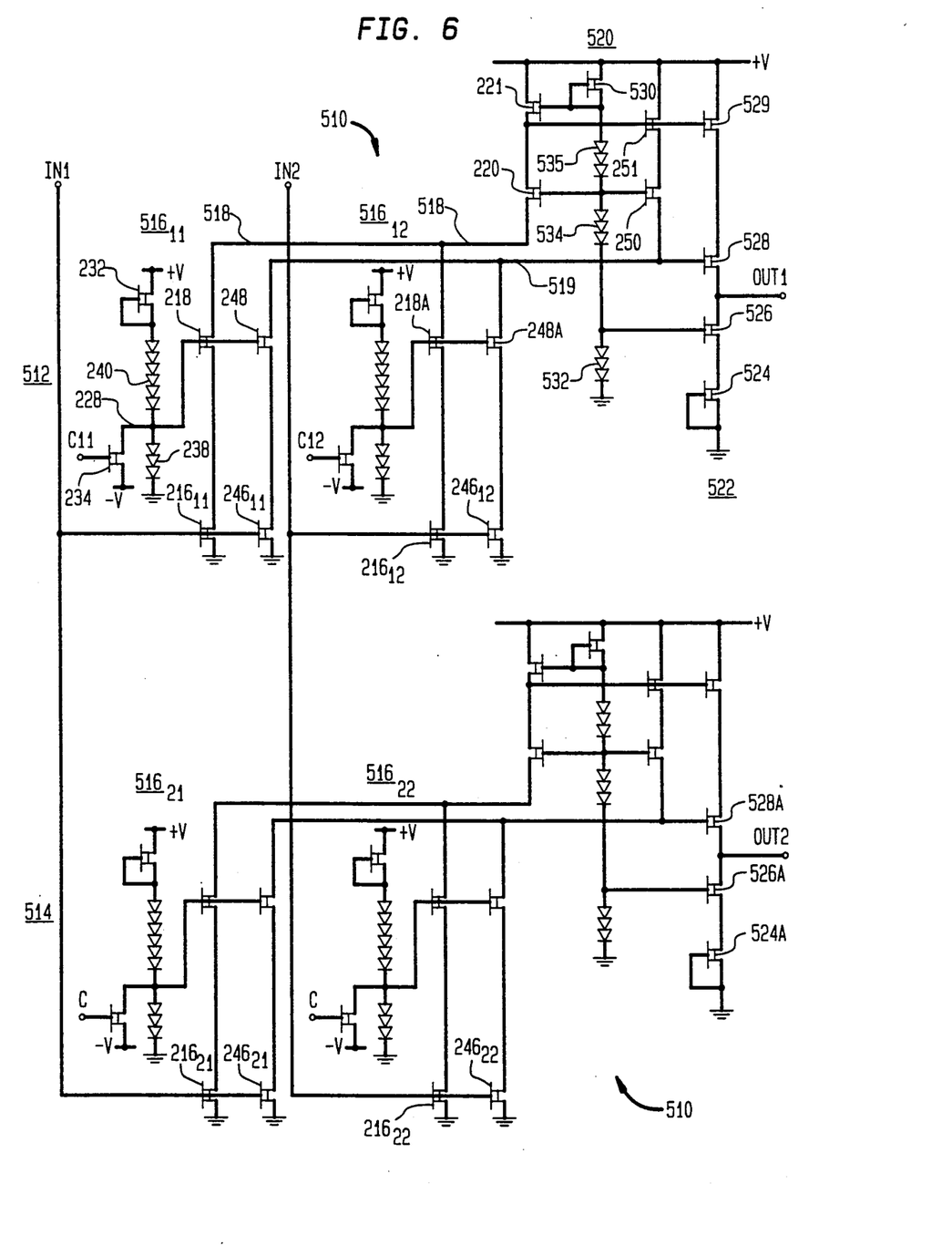
FIG. 6 is a schematic diagram of a crosspoint matrix switch implementation using the wideband analog solid-state switch illustrated in FIG. 3.

A crosspoint matrix switch implementation of each of the three exemplary embodiments of the analog solid-state switches illustrated in FIGS. 1-3 is depicted in FIGS. 4-6 respectively. Each embodiment has two analog inputs and two analog outputs; therefore, each matrix comprises four identical analog solid-state switches in a 2×2 array. Each switching element will hereinafter be referred to as a crosspoint. Hereinafter, each crosspoint will be represented by two subscripts: the first subscript will correspond to the row or output, and the second subscript will correspond to the column or input. It will be understood that a crosspoint matrix switch having two inputs and two outputs is merely exemplary, and that a person skilled in the art can employ as many inputs and outputs and as many corresponding crosspoints as is required.

Each switching element in the crosspoint matrix switch must be made small in order to keep the size of the matrix from becoming unmanageable and to avoid heavy capacitive loading of the inputs. However, the use of smaller switching elements reduces the output drive capability of the device. Therefore, a crosspoint matrix switch typically requires output buffering. The embodiments of the three crosspoint matrix switches illustrated in FIGS. 4–6 all employ output buffers for output drive capability.

Referring now to the schematic diagram in FIG. 4, the crosspoint matrix switch 310 illustrated therein is implemented with the switch 10 shown in FIG. 1. The reference numerals for elements in FIG. 1 corresponding to those elements in FIG. 4 have been retained. The 2×2 matrix switch 310 shown has a first and second stage 312 and 314; each stage corresponds to an output OUT1 and OUT2. The first stage 312 has a first and second crosspoint $316_{11}$ and $316_{12}$. The first input line IN1 supplies the first crosspoint $316_{11}$ and the second input line IN2 supplies the second crosspoint $316_{12}$. The outputs of the two crosspoints $316_{11}$ and $316_{12}$ are tied together by conductor 318 and are fed into a common output buffer 320. The second stage 314 is identical to the first stage 312. The first input line IN1 supplies the first crosspoint $316_{21}$ and the second input line IN2 supplies the second crosspoint $316_{22}$. The outputs of the two crosspoints $316_{21}$ and $316_{22}$ are tied together and are fed into a common output buffer of the second stage 314. Each crosspoint matrix switch 310 has M×N control lines, one control line for each crosspoint 316. For the embodiment shown in FIG. 4, the crosspoint matrix switch 310 has four control lines which are designated by the letter C. For convenience, only the first crosspoint $316_{11}$ and the common output buffer 320 of the first stage 312 will be described.

The crosspoint $316_{11}$ consists of first, second, third and fourth FETs 16, 18, 32 and 34 and first and second diode strings 38 and 40. The first and second FETs 16 and 18 are connected in series along their drain-source path. The source of the first FET 16 is grounded. The drain-source path of the third FET 32 is connected in series with the first and second diode strings 38 and 40, thus forming a path between a positive voltage source and ground. The gate of the third FET 32 is tied its source, thereby creating a constant-current supply to generate voltage drops across diode strings 38 and 40 in order to supply FETs 16 and 18 with the proper operating potential. The drain of the fourth FET 34 is connected to the gate of the second FET 18 by conductor 28. The source of FET 34 is connected to a negative voltage supply (−V). Conductor 28 is directed to ground by the first diode string 38. The control line C11 is connected to the gate of the fourth FET 34.

To connect a row of crosspoints 316 in the 2×2 array, the drains of the second FETs of each stage are connected to the drain of FET $18_{12}$ by conductor 318 and the drain of FET $18_{21}$ is connected to the drain of FET $18_{22}$. To connect the stages 312 and 314, the first input signal (IN1) is supplied to the gates of FETs $16_{11}$ and $16_{21}$ by conductor IN1. Similarly, the second input signal (IN2) is supplied to the gates of FETs $16_{12}$ and $16_{22}$ by conductor IN2. Each crosspoint 316 should be kept small to maintain a high input-impedance for the switch 310.

The common output buffer 320 comprises a fifth FET 329 which forms the non-linear load that is common to all of the crosspoints $316_{11}$ and $316_{12}$ in the first stage 312, an amplifier circuit 322 comprising sixth (324), seventh (326), and eighth FETs (328), and a voltage reference circuit comprising a ninth FET 330, and a third and fourth diode string 332 and 334. The drain-source paths of the sixth, seventh and eight FETs 324, 326 and 328 are connected in series, thus forming a path from a positive voltage source to ground. The gate of the sixth FET 324 is tied to its source. The gate of the eighth FET 328 is connected to conductor 318. The gate of the ninth FET 330 is connected to its source, thereby forming a constant-current supply. The current source FET 330 is connected in series with the third and fourth diode strings 332 and 334, thus forming a path between the positive voltage source and ground. The gate of FET 326 is directed to ground through the third diode string 332. The gate of the fifth FET 329 is directed to ground through the third and fourth diode strings 332 and 334.

To complete the crosspoint matrix switch 310, the first output is supplied by conductor OUT1 which is connected to the junction between the seventh and eighth FETs 326 and 328. Similarly, the second output is supplied by conductor OUT2 which is connected to the junction between the seventh and eighth FETs 328A and 326A.

During operation of the crosspoint matrix switch 310 illustrated in FIG. 4, each stage 312 and 314 can output only one input signal; therefore, mixing of the input signals is not allowed. Both stages 312 and 314 may output the same input signal or any combination thereof. As a result, the crosspoint matrix can "broadcast" any one input signal over one or both of its two outputs.

When crosspoint $316_{11}$ is actuated by an input over control line $C_{11}$, the first and second FETs 16 and 18 conduct to complete a path with the fifth FET 329, thereby forming the switch 10 shown in FIG. 1. The output of the fifth FET 329 drives the amplifier circuit. The eighth FET 328 acts as a source follower whose load is the FET 324–326 combination. The FETs 324 and 326 form a cascoded current-source whose high impedance reduces attenuation through the output buffer 320. The current source FET 330 generates voltage drops over the diode strings 332 and 334 which supplies the proper voltages to FETs 326 and 329.

The crosspoint matrix switch 310 possesses a very linear input/output transfer characteristic which provides low distortion of the input signal over a wide bandwidth. When the control input over line C turns off the crosspoint 316, the crosspoint 316 offers very high isolation of the output from the input signal; therefore, the crosstalk between channels is very low. Because the crosspoint matrix switch 310 is fabricated as an integrated circuit, it is small, cost effective and dissipates low power.

Referring now to the schematic diagram in FIG. 5, the crosspoint matrix switch 410 illustrated therein is implemented with the cascode switch 110 shown in FIG. 2. Therefore, the reference numerals for the elements in FIG. 2 corresponding to the elements in FIG. 5 have been retained. The design of the crosspoint matrix switch 410 is similar to that of the matrix switch illustrated in FIG. 4. The only difference is a second cascode pair to match the transfer characteristics for each first cascode pair. Therefore, the reference numerals for the elements in FIG. 4 corresponding to the elements in FIG. 5 have been increased by one hundred.

The 2×2 matrix switch 410 shown has a first and second stage 412 and 414 corresponding to outputs OUT1 and OUT2. The first stage 412 has a first and second crosspoint $416_{11}$ and $416_{12}$. The first input line IN1 supplies the first crosspoint $416_{11}$; the second input line IN2 supplies the second crosspoint $416_{12}$. The outputs of the two crosspoints $416_{11}$ and $416_{12}$ are tied together by conductor 418 and fed into a common output buffer 420. Four control lines are designated by the letter C. The second stage 414 is identical to the first stage 412.

The crosspoint $416_{11}$ consists of first, second, third and fourth FETs 116, 118, 132 and 134 and first and second diode strings 138 and 140. The first and second FETs 116 and 118 are connected in series along their drain-source path. The source of the first FET 116 is grounded. The drain-source path of the third FET 132 is connected in series with the first and second diode strings 138 and 140, thus forming a path between a positive voltage source and ground. The gate of the third FET 132 is tied its source, thereby creating a constant-current supply to generate voltage drops across diode strings 138 and 140 in order to supply FETs 116 and 118 with the proper operating potential. The drain of the fourth FET 134 is connected to the gate of the second FET 18 by conductor 128. The source of FET 134 is connected to a negative voltage supply ($-V$). Conductor 128 is directed to ground by the first diode string 138. The control line $C_{11}$ is connected to the gate of the fourth FET 134.

The drains of the second FETs of each stage are connected together. Therefore, the drain of FET $118_{11}$ is connected to the drain of FET $118_{12}$ by conductor 418, and the drain of FET $118_{21}$ is connected to the drain of FET $118_{22}$. To connect the stages 412 and 414, the first input signal is supplied to the gates of FETs $116_{11}$ and $116_{21}$ by conductor IN1. Similarly, the second input signal is supplied to the gates of FETs $116_{12}$ and $116_{22}$ by conductor IN2.

The common output buffer 420 comprises fifth and sixth FETs 120 and 121 which form the second cascode pair that is common to all of the crosspoints $416_{11}$ and $416_{12}$ in the first stage 412, and an amplifier circuit 422 comprising seventh through both FETs 424, 426, 428, and 429, and a voltage reference circuit comprising an eleventh FET 430, and third, fourth and fifth diode strings 432, 434 and 435. The drain-source path of the series-connected fifth and sixth FETs 120 and 121 are connected between a positive voltage source and conductor 418. The drain-source paths of the seventh through tenth FETs 424–429 are connected in series, thus forming a path between a positive voltage source and ground. The gate of the seventh FET 424 is tied to its source. The gate of the ninth FET 428 is connected to conductor 418. The gate of the eleventh FET 430 is connected to its source, thereby forming a constant-current supply. The current source FET 430 is connected in series with the third, fourth and fifth diode strings 432–435, thus forming a path between the positive voltage source and ground. The gate of FET 426 is directed to ground through the third diode string 432. The gate of the fifth FET 120 is directed to ground through the third and fourth diode string 432 and 434. The gate of the sixth FET 121 is directed to ground through the third through fifth diode strings 432–435.

To complete the switch, the first output is supplied by conductor OUT1 which is connected to the junction between the eighth and ninth FETs 426 and 428. Similarly, the second output is supplied by conductor OUT2 which is connected to the path between the eighth and ninth FETs of the second stage 414, namely FETs 426A and 428A.

During operation, the crosspoint matrix switch 410 illustrated in FIG. 5 selects the crosspoints 416 in the same manner as the matrix switch 310 shown in FIG. 4. Once a crosspoint 416 has been selected, the combination of crosspoint 416 and FETs 120 and 121 operates in the same manner as the cascode switch 110 shown in FIG. 2. Therefore, the DC voltages across FETs 116 and 120 are matched such that the linearity of the crosspoint matrix switch 410 is greater than the linearity of the matrix switch 310 illustrated in FIG. 4.

Referring now to the schematic diagram in FIG. 6, the crosspoint matrix switch 510 illustrated therein is implemented with the two-stage switch 210 shown in FIG. 3. Therefore, the reference numerals for the elements in FIG. 3 corresponding to the elements in FIG. 6 have been retained. The design of the crosspoint matrix switch 510 is similar to that of the matrix switch illustrated in FIG. 5. The only difference is that an inversion circuit is added to each crosspoint.

The 2×2 matrix switch 510 has a first and second stage 512 and 514 corresponding to the outputs on conductors OUT1 and OUT2 respectively. The first stage 512 has a first and second crosspoint $516_{11}$ and $516_{12}$. The first input line IN1 supplies the first crosspoint $516_{11}$; the second input line IN2 supplies the second crosspoint $516_{12}$. The outputs of the two crosspoints $516_{11}$ and $516_{12}$ are supplied by conductors 518 and 519 and are fed into a common output buffer 520. Four control lines are designated by the letter C. The second stage 514 is identical to the first stage 512.

The crosspoint $516_{11}$ consists of first through fourth FETs 216, 218, 246 and 248, fifth and sixth FETs 232 and 234 and first and second diode strings 238 and 240. The first and second FETs 216 and 218 are connected in series along their drain-source path. The source of the first FET 216 is grounded. The third and fourth FETs 246 and 248 are connected in series along their drain-source path. The source of the third FET 246 is grounded. The drain-source path of the fifth FET 232 is connected in series with the first and second diode strings 238 and 240, thus forming a path between a positive voltage source and ground. The gate of the fifth FET 232 is tied its source, thereby creating a constant-current supply. The drain of the sixth FET 234 is connected to the gates of the second and fourth FETs 218 and 248 by conductor 228. The source of FET 234 is connected to a negative voltage supply ($-V$). Conductor 228 is directed to ground by the first diode string 238. The control line $C_{11}$ is connected to the gate of the sixth FET 234.

The drains of the second FETs 218, 218A of each stage 512 and 514 are connected together by conductor 518, and the drains of the fourth FETs 248, 248A of each stage 512 the stages 512 and 514, the first input signal (IN1) is supplied to the gates of FETs $216_{11}$, $216_{21}$, $246_{11}$ and $246_{21}$. Similarly, the second input signal (IN2) is supplied to the gates of FETs $216_{12}$, $216_{22}$, $246_{12}$ and $246_{22}$.

The common output buffer 520 comprises seventh through tenth FETs 220, 221, 250 and 251 which form the second stage of the non-linear load that is common to all of the crosspoints $516_{11}$ and $516_{12}$ in the row, an amplifier circuit 522 comprising eleventh through fourteenth FETs 524, 526, 528, and 529, and a voltage reference circuit comprising a fifteenth FET 530, and third, fourth and fifth diode strings 532, 534 and 535. The drain-source path of the series-connected seventh and eighth FETs 220 and 221 are connected between the positive voltage supply and conductor 518. The drain-source paths of the series-connected ninth and tenth FETs 250 and 251 are connected between the positive voltage supply and conductor 519. The drain-source paths of the eleventh through fourteenth FETs 524, 526, 528 and 529 are connected in series, thus forming a path between a positive voltage source and ground. The gate of the eleventh FET 524 is tied to its source. The gate of the thirteenth FET 528 is connected to conductor 519. The gate of the fifteenth FET 530 is connected to its source, thereby forming a constant-current supply. The current source FET 530 is connected in series with the third, fourth and fifth diode strings 532–535, thus forming a path between the positive voltage source and ground. The gate of FET 526 is directed to ground through the third diode string 532. The gates of the seventh and ninth FETs 220 and 250 are directed to ground through the third and fourth diode string 532 and 534. The gates of the eight and tenth FETs 221 and 251 are directed to ground through the third through fifth diode strings 532–535.

To connect the stages 512 and 514, the first output is supplied by conductor OUT1 which is connected to the junction between the twelfth and thirteenth FETs 526 and 528. Similarly, the second output is supplied by conductor OUT2 which is connected to the junction between the twelfth and thirteenth FETs of the second stage 514, namely 526A and 528A.

During operation, the crosspoint matrix switch 510 illustrated in FIG. 6 selects the crosspoints 516 in the same manner as the matrix switch 310 shown in FIG. 4. Once a crosspoint 516 has been selected, the combination of crosspoint 516 and FETs 220, 221, 250 and 251 operates in the same manner as the two-stage switch 210 shown in FIG. 3. Therefore, the AC voltages across FETs 246 and 250 are matched such that the distortion of the input signal is reduced as the bandwidth is maintained, thereby improving the match of transfer characteristics over the matrix switch 410 illustrated in FIG. 5.

Although the instant invention has been described in connection with three highly specific exemplary embodiments thereof, it will be understood that many variations and modifications can be made by those of ordinary skill in the art. Therefore, it is manifestly intended that this invention be only limited by the claims and the equivalents thereof.

What is claimed is:

1. An analog solid-state switch for passing a wide frequency band of input signals with low distortion, said switch having an input terminal and an output terminal, comprising:

a load means coupled to a supply of operating potential and having a resistive value such that current flowing through said load means causes a voltage drop, and said output terminal being connected to the load means such that an output voltage on the output terminal is the difference between the operating potential and said voltage drop;

a switching means for providing a conducting path for the flow of current in a first state (ON), and for preventing the flow of current in a second state (OFF), said load means and switching means being coupled in series;

a modulating means coupled between said switching means and a point of reference potential for receiving an input signal at said input terminal, said modulating means being controlled by the input signal; and a control means for simultaneously actuating said load means and said switching means, whereby when said analog solid-state switch is turned OFF, said switching means prevents current from flowing to said output terminal, thereby isolating said input terminal from said output terminal, and whereby when said analog solid-state switch is ON, said input signal modulates the current flowing through said load, switching and modulating means, thereby causing a voltage drop across said load means, wherein said modulating, switching, and load means include identical first, second and third transistors respectively having non-linear input/output transfer characteristics, wherein said control means supplies a control voltage to said second and third transistors such that the transfer characteristics of said first and third transistors coincide, to cause said analog solid state switch to output a replica of the input signal, and wherein said output signal is an inverted and DC-shifted replica of said input signal;

and further comprising a restoring means coupled to said output terminal for restoring the DC level to ground.

2. An analog solid-state switch according to claim 1, wherein said restoring means is a blocking capacitor.

3. An analog solid-state switch for passing a wide frequency band of input signals with low distortion, said switch having an input terminal and an output terminal, comprising:

a load means coupled to a supply of operating potential and having a resistive value such that current flowing through said load means causes a voltage drop, and said output terminal being connected to the load means such that an output voltage on the output terminal is the difference between the operating potential and said voltage drop;

a switching means for providing a conducting path for the flow of current in a first state (ON), and for preventing the flow of current in a second state (OFF), said load means and switching means being coupled in series;

a modulating means coupled between said switching means and a point of reference potential for receiving an input signal at said input terminal, said modulating means being controlled by the input signal; and a control means for simultaneously actuating said load means and said switching means, whereby when said analog solid-state switch is turned OFF, said switching means prevents current from flowing to said output terminal, thereby isolating said input terminal from said output terminal, and whereby when said analog solid-state switch is ON, said input signal modulates the current flowing through said load, switching and modulating means, thereby causing a voltage drop across said load means, wherein said modulating, switching, and load means include identical first, second and third transistors respectively having non-linear input/output transfer characteristics, and wherein said control means supplies a control voltage to said second and third transistors such that the transfer characteristics of said first and third transistors coincide, to cause said analog solid state switch to output a replica of the input signal, and wherein said output signal, is an inverted, DC-shifted replica of said input signal, and further comprising means coupled to said output terminal for inverting the output of said analog solid-state switch.

4. An analog solid-state switch for passing a wide frequency band of input signals with low distortion, said switch having an input terminal and an output terminal, comprising:

- a load means coupled to a supply of operating potential and having a resistive value such that current flowing through said load means causes a voltage drop, and said output terminal being connected to the load means such that an output voltage on the output terminal is the difference between the operating potential and said voltage drop;
- a switching means for providing a conducting path for the flow of current in a first state (ON), and for preventing the flow of current in a second state (OFF), said load means and switching means being coupled in series;
- a modulating means coupled between said switching means and a point of reference potential for receiving an input signal at said input terminal, said modulating means being controlled by the input signal; and
- a control means for simultaneously actuating said load means and said switching means, whereby when said analog solid-state switch is turned OFF, said switching means prevents current from flowing to said output terminal, thereby isolating said input terminal from said output terminal, and whereby when said analog solid-state switch is ON, said input signal modulates the current flowing through said load, switching and modulating means, thereby causing a voltage drop across said load means, wherein said modulating, switching, and load means include identical first, second and third transistors respectively having non-linear input/output transfer characteristics, and wherein said control means supplies a control voltage to said second and third transistors such that the transfer characteristics of said first and third transistors coincide, to cause said analog solid state switch to output a replica of the input signal, wherein voltages across said first and third transistors are not identical, thus increasing the distortion and attenuation of said input signal, said analog solid-state switch further comprising a first matching means coupled to said output terminal for improving the match of the DC voltage across said first and third transistors thereby increasing the linearity of said analog solid-state switch.

5. An analog solid-state switch according to claim 4, further comprising a second matching means coupled to the output terminal for improving the match of the instantaneous voltage across said first and third transistors, thereby decreasing the attenuation and non-linearity of the input signal while maintaining the bandwidth of said analog solid-state switch.

6. An analog solid-state switch according to claim 4, further comprising a fourth transistor that is identical to said first, second and third transistors, said fourth transistor being coupled between said supply of operating potential and said third transistor, said control means operating said fourth transistor simultaneously with said second and third transistors, wherein said difference between the control voltage of said second transistor and the average input voltage of said first transistor equals the difference between the control voltages of said fourth and third transistors, thereby matching the transfer characteristics of a cascode pair formed by said first and second transistors with that of a cascode pair formed by said fourth and third transistors.

7. An analog solid-state switch according to claim 6, further comprising a second matching means coupled to the output terminal for improving the match of the instantaneous voltage across said first and third transistors, thereby decreasing the attenuation and non-linearity of the input signal while maintaining the bandwidth of said analog solid-state switch.

8. An analog solid-state switch according to claim 7, wherein said second matching means are fifth, sixth, seventh and eighth transistors connected in series and forming a path between said source of operating potential and said point of reference potential, the control input of the third, second and first transistors are connected to the control inputs of said fifth, sixth and seventh transistors respectively, the control input of said eighth transistor coupled to a point between said third and fourth transistors, and the output of said analog solid-state switch connected to a point between said fifth and sixth transistors, whereby the instantaneous AC value of the control input to said eighth transistor varies with the inversion of the input signal causing the voltage across the seventh transistor to track the voltage across the fifth transistor.

9. An analog solid-state switch according to claim 8, wherein the ratios among the fifth, sixth, seventh and eighth transistors are the same as those among the third, second, first and fourth transistors respectively.

10. An analog solid-state switch according to claim 8, wherein the first through eighth transistors are relatively identical.

11. A crosspoint matrix switch having N inputs and M outputs coupled to a source of operating potential, for broadcasting of one of N inputs over at least one of M outputs, comprising:

- at least M load means each coupled to a supply of operating potential and having a resistive value such that current flowing through said load means causes a voltage drop, an output terminal being connected to each of the load means such that the voltage at each output terminal is the difference between the operating potential and the voltage drop caused by current flowing through its respective load means; and
- at least M times N crosspoints, each of the M outputs having at least N parallel connected crosspoints, in which each crosspoint is for switching one of the at least N inputs to one of the at least M outputs, each of said crosspoints comprising:

a switching means for providing a conducting path for the flow of current in a first state (ON), and for preventing the flow of current in a second state (OFF), said load means and switching means being coupled in series;

a modulating means coupled between said switching means and a point of reference potential for receiving an input signal at one of the input terminals, the modulating means being controlled by an input signal on said input terminal; and a control means for simultaneously actuating said load means and said switching means, whereby when said switching means switch is turned OFF, said switching means prevents current from flowing to its respective output terminal, thereby isolating its respective input terminal from its respective output terminal, and whereby when said switching means is ON, said input signal modulates the current flowing through said load means, switching means, and modulating means, thereby causing a voltage drop across said load means, wherein said switching means, modulating means and load means each include identical transistors having non-linear input/output transfer characteristics, and wherein said control means applies the correct operating voltages to said transistors, whereby said crosspoint matrix switch outputs a replica of the input signal, said output signal being an inverted and DC-shifted replica of said input signal and further comprising at least one restoring means coupled to said output line for restoring the DC level of each row to ground.

12. A crosspoint matrix switch according to claim 11 further comprising at least one amplification means coupled to said load means for amplifying the output of the load means.

13. A crosspoint matrix switch according to claim 11, wherein said restoring means is a blocking capacitor.

14. A crosspoint matrix switch having N inputs and M outputs coupled to a source of operating potential, for broadcasting of one of N inputs over at least one of M outputs, comprising:

at least M load means each coupled to a supply of operating potential and having a resistive value such that current flowing through said load means causes a voltage drop, an output terminal being connected to each of the load means such that the voltage at each output terminal is the difference between the operating potential and the voltage drop caused by current flowing through its respective load means; and at least M times N crosspoints, each of the M outputs having at least N parallel connected crosspoints, in which each crosspoint is for switching one of the at least N inputs to one of the at least M outputs, each of said crosspoints comprising:

a switching means for providing a conducting path for the flow of current in a first state (ON), and for preventing the flow of current in a second state (OFF), said load means and switching means being coupled in series;

a modulating means coupled between said switching means and a point of reference potential for receiving an input signal at one of the input terminals, the modulating means being controlled by an input signal on said input terminal; and a control means for simultaneously actuating said load means and said switching means, whereby when said switching means switch is turned OFF, said switching means prevents current from flowing to its respective output terminal, thereby isolating its respective input terminal from its respective output terminal, and whereby when said switching means is ON, said input signal modulates the current flowing through said load means, switching means, and modulating means, thereby causing a voltage drop across said load means, wherein said switching means, modulating means and load means each include identical transistors having non-linear input/output transfer characteristics, and wherein said control means applies the correct operating voltages to said transistors, whereby said crosspoint matrix switch outputs a replica of the input signal, wherein said output signal being an inverted and DC-shifted replica of said input signal and further comprising at least one inverting means coupled to said output line for inverting the output of each row of said crosspoint matrix switch.

15. A crosspoint matrix switch having N inputs and M outputs coupled to a source of operating potential, for broadcasting of one of N inputs over at least one of M outputs, comprising:

at least M load means each coupled to a supply of operating potential and having a resistive value such that current flowing through said load means causes a voltage drop, an output terminal being connected to each of the load means such that the voltage at each output terminal is the difference between the operating potential and the voltage drop caused by current flowing through its respective load means; and at least M times N crosspoints, each of the M outputs having at least N parallel connected crosspoints, in which each crosspoint is for switching one of the at least N inputs to one of the at least M outputs, each of said crosspoints comprising:

a switching means for providing a conducting path for the flow of current in a first state (ON), and for preventing the flow of current in a second state (OFF), said load means and switching means being coupled in series;

a modulating means coupled between said switching means and a point of reference potential for receiving an input signal at one of the input terminals, the modulating means being controlled by an input signal on said input terminal; and a control means for simultaneously actuating said load means and said switching means, whereby when said switching means switch is turned OFF, said switching means prevents current from flowing to its respective output terminal, thereby isolating its respective input terminal from its respective output terminal, and whereby when said switching means is ON, said input signal modulates the current flowing through said load means, switching means, and modulating means, thereby causing a voltage drop across said load means, wherein said switching means, modulating means and load means each include identical transistors having non-linear input/output transfer characteristics, and wherein said control means applies the correct operating voltages to said transistors, whereby said crosspoint matrix switch outputs a replica of the input signal, each crosspoint providing a voltage across said transistor of said modulating means which is not identical to said voltage across said transistor of said load means, thus increasing the distortion and attenuation of said associated input signal, said matrix switch further comprising a first matching means coupled to an output terminal for improving the match of the DC voltage across said transistor of said load means with a selected modulating means transistor, thereby increasing linearity of said load means and selected crosspoint.

16. A cross-point matrix switch according to claim 15, wherein said first matching means includes a transistor, said transistor being connected between said operating potential and said transistor of the load means, wherein the difference between the control voltage of said transistor of said switching means and the average gate voltage of said transistor of said modulating means for the selected crosspoint equals the difference between the control voltages of said transistors of said first matching means and load means, thereby matching the DC transfer characteristics of the transistors of the selected crosspoint with that of a cascode pair formed by said transistors of said load means and first matching means.

17. A cross-point matrix switch according to claim 15, further comprising a second matching means for improving the match of the AC voltage across the transistors of said load means and modulating means, thereby decreasing the attenuation and non-linearity of the input signal while maintaining the bandwidth of said crosspoint matrix switch.

18. A crosspoint matrix switch according to claim 17, said second matching means having at least M first inversion circuits, each first inversion circuit corresponding to a row of crosspoints, and at least M times N second inversion circuits, each second inversion circuit corresponding to a crosspoint, wherein said first inversion circuit are first and second transistors, the control input of said first transistor being connected to the control input of said transistor of said common-load means, the control input of said second transistor is connected to the conducting path between said transistors of said common-load and first matching means, and the conducting paths of said first and second transistors are connected in series, and wherein said second inversion circuit are third and fourth transistors, the control inputs of said third and fourth transistors being connected to the control inputs of the respective transistors of said switching and modulating means, and the conducting paths of said third and fourth transistors are connected in series, whereby when a crosspoint is selected, the conducting paths of said transistors of said first inversion circuit connect in series with the conducting path of the third and fourth transistors in the second inversion circuit of the selected crosspoint to form a path between a source of potential and ground, thereby causing the instantaneous voltage across the first transistor of said first inversion circuit to track the voltage across the fourth transistor of said second inversion circuit of the selected crosspoint.

19. The apparatus according to claim 18, wherein said transistors are N-channel FETs.

20. The apparatus according to claim 18, wherein said transistors are P-channel FETs.

21. The apparatus according to claim 19, wherein said transistors are fabricated from GaAs.

22. The apparatus according to claim 20, wherein said transistors are fabricated from GaAs.

* * * * *